United States Patent [19]

Matsuno

[11] Patent Number: 4,599,571

[45] Date of Patent: Jul. 8, 1986

[54] LEVEL COMPENSATION CIRCUIT

[75] Inventor: Keishi Matsuno, Hino, Japan

[73] Assignee: Iwatsu Electric Co., Ltd., Tokyo, Japan

[21] Appl. No.: 731,285

[22] Filed: May 7, 1985

[30] Foreign Application Priority Data

Jul. 18, 1984 [JP] Japan ............................... 59-149148

[51] Int. Cl.⁴ ............................................ H03F 3/217
[52] U.S. Cl. ........................................ 330/11; 330/10; 330/251
[58] Field of Search ................... 330/10, 11, 251, 290, 330/97

[56] References Cited

U.S. PATENT DOCUMENTS 3,207,998  9/1965  Corney et al. ...................... 330/11

Primary Examiner—Eugene R. LaRoche
Assistant Examiner—Steven J. Mottola
Attorney, Agent, or Firm—Oblon, Fisher, Spivak, McClelland & Maier

[57] ABSTRACT

In an amplifier including an AC amplifier, its operation level shifts according to input waveforms. This invention describes a circuit to eliminate the level shift. An output of the AC amplifier is fed to a level shift detector, wherein the level shift is detected to provide an error signal to a pulse width modulation circuit. In this circuit, a pulse of a pulse width corresponding with the level shift is generated and fed to a preamplifier, wherein the input waveform and the pulse are synthesized to be fed back to the AC amplifier. This feed back loop clamps a zero level of the input waveforms.

6 Claims, 4 Drawing Figures

LEVEL COMPENSATION CIRCUIT

BACKGROUND OF THE INVENTION

This invention relates generally to an operating level compensation circuit for compensating an operating level of a high gain amplifier to amplify a very small signal, for instance, a small electrical signal converted from a very small optical signal, and more particularly to a circuit for compensating an operating level of an amplifier including an alternative current amplifier (AC amplifier) which amplifies such a small signal, to keep always a zero level of the signal being constant in spite of various signal waveforms and amplitudes in order to improve a linearity of the amplifier and to suppress fluctuations of a dynamic range of the amplifier.

Recently, top engineerings such as optical fiber communication and so forth have been remarkably developed by supporting of high speed semiconductor technique. In such engineering fields, a wide bandwidth, low noise and high gain amplifier has been more required and it has been important problem to develop the high performance amplifier.

The optical signal has been converted to the electrical signal to be amplified, wherein the high gain amplifier has been required, because the signal has generally been very small. It has been better in not only a performance but a cost to employ the AC amplifier having an enough low cut off frequency than to employ cascaded direct current amplifiers (DC amplifiers) including an unavoidable inherent problem of DC drift.

In the optical fiber communication and so forth, the AC amplifier, which has had no problem of the drift and is operatable with a single power supply, miniaturizable and minimizable in power consumption, has been used, because it has not been needed to employ DC amplifiers.

However, in an optical signal measurement and so forth, for instance, in an optical time domain reflectometer (OTDR), it has sent optical pulses from a terminal of a fiber, has amplified and displayed reflective waves from many points of the fiber in order to measure characteristics and to locate disconnections of the fiber, wherein it has been needed to accurately detect a zero level of faint signals of the reflective waves and to use DC amplifiers.

Although, the DC amplifiers including the drift problem and a difficulty of cascaded connections, and requiring plural power supply, have not been always suitable for amplifying the faint signals.

Particularly, in the OTDR, it has been an important subject to get a wide dynamic range amplifier for amplifying the both extremes of the very big amplitude signal from vicinity of a measuring terminal and the faint signal from a distant portion.

In the OTDR, a logarithmic amplifier for amplifying back scattering waves caused by the Rayleigh scattering of the fiber and the reflective waves caused by the Fresnel reflection from discontinuities such as junction points of fibers, a disconnecting point and so forth, has been employed in order to get a wide dynamic range and to measure attenuation characteristics of the fiber.

In the logarithmic amplifiers, for reasons to avoid the drift and to get high gain, the AC amplifier has been conventionally employed.

Thereupon, in the OTDR, for the reasons above, the wide band, high gain and wide dynamic range amplifier has been required. However there are disadvantages that such a conventional AC amplifier has been not only expensive but disadvantageous in its characteristics that its dynamic range and accuracy have been seriously influenced by fluctuations of its operation level due to variations of input signal waveforms, for instance, variations of a duty cycle of input pulses.

Especially, in the high gain logarithmic amplifier comprising cascaded logarithmic amplifiers coupled by capacitors between them, the fluctuations of the operation level have caused remarkable deterioration of measurement accuracy due to the logarithmic characteristics, therefor good performances have not been obtainable unless compensations to stabilize the operation level.

SUMMARY OF THE INVENTION

It is an object of the invention to provide a novel, very accurate and inexpensive level compensation circuit for an AC amplifier.

Another object of the invention is to provide a driftless, wide dynamic range and high gain amplifying means.

A further object of the present invention is to provide amplifying means for logarithmically amplifying in OTDR.

According to one general aspect of the invention, there is provided a level compensation circuit comprising;

a preamplifier for amplifying an input signal and getting a synthesized signal of the input signal and a level compensation signal;

level shift detection means for detecting a zero level of the input signal in the synthesized signal to be amplified by an AC amplifier, and for comparing the zero level to a reference level to feed out an error signal;

pulse width modulation means for generating a pulse of a pulse width corresponding with said error signal; and coupling means for coupling said pulse generated by said pulse width modulation means to said preamplifier, whereby said synthesized signal if fed to said AC amplifier.

Other objects, advantages and features of the present invention will become apparent to those having ordinary skill in the art upon a reading of the following description when taken in conjunction with the accompanying drawings.

BRIEF DESCRIPTION OF THE DRAWINGS

The principle, construction and operation of this invention will be clearly understood from the following detailed description taken in conjunction with the accompanying drawings, in which.

DESCRIPTION OF THE PREFERRED EMBODIMENTS

Figure 1:
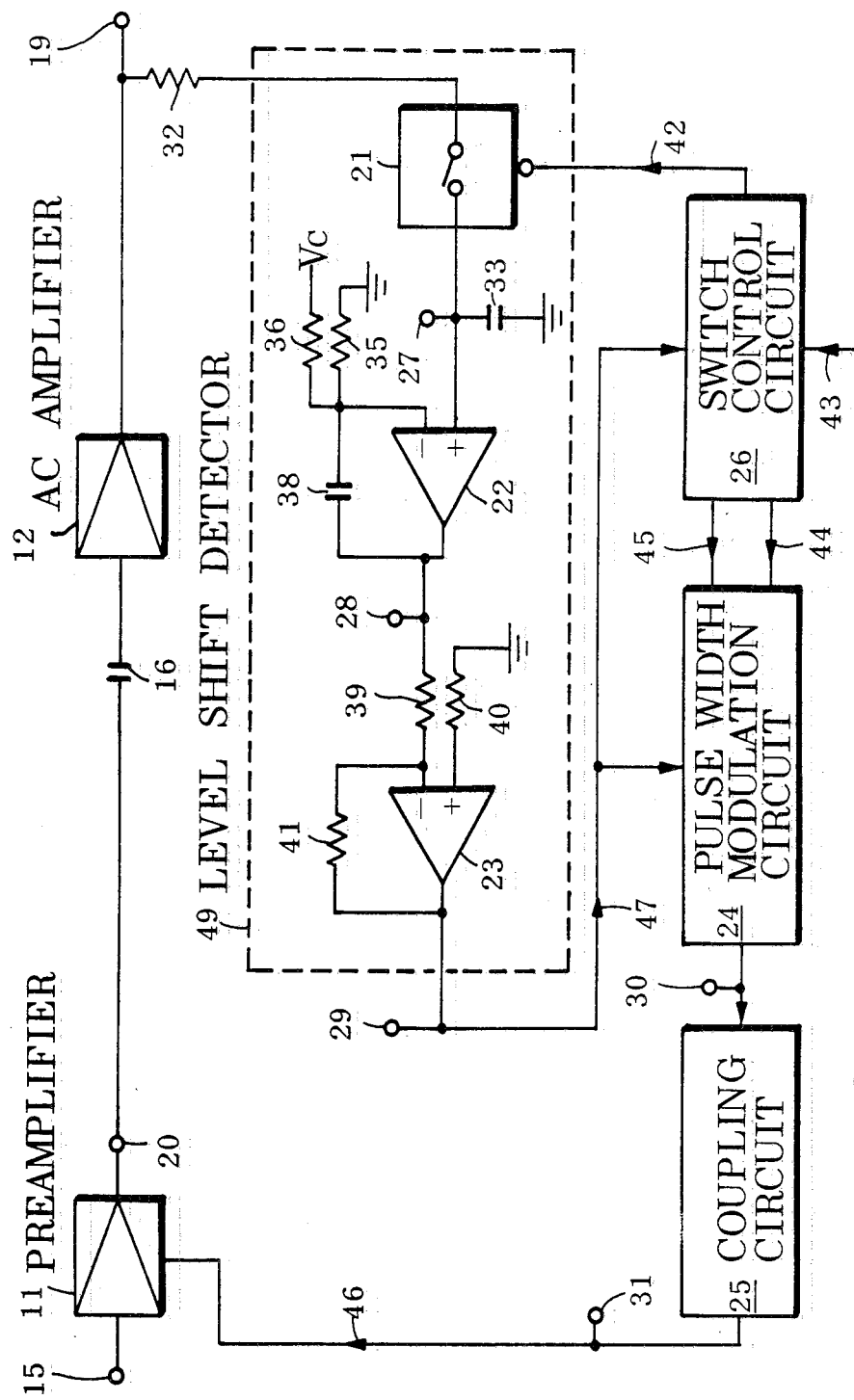
FIG. 1 is a circuit diagram showing an embodiment of this invention.

With reference to FIG. 1 showing an embodiment of the present invention, reference numeral 11 indicates a preamplifier having an input terminal 15 and an output terminal 20; 12 identifies an AC amplifier connected to the output terminal 20 through a capacitor 16; 19 denotes an output terminal of the AC amplifier 12; 49 shows a level shift detector including a high speed analog semiconductor switch 21, an operational amplifier 22 having FET inputs of high impedance, a large open loop gain and a small drift of a offset voltage, an operational amplifier 23, a capacitor 33 for holding a signal sampled by the switch 21, a capacitor 38 for stabilizing the operation of the operational amplifier 22 which has an amplification limited in high frequency to keep it from oscillating, resistors 35 and 36 setting a reference level from a power source Vc, resistors 39 and 41 setting a gain of the operational amplifier 23 which constructs an inverting amplifier, and a resistor 40 for biasing; 32 refers to a resistor connecting the switch 21 to the output terminal 19; 29 indicates an output terminal of the level shift detector 49; 27 and 28 designate respectively output terminals of the switch 21 and the operational amplifier 22; 24 identifies a pulse width modulation circuit; 25 indicates a coupling circuit which output is added to the output of the preamplifier 11; 30 and 31 identify respectively outputs of the pulse width modulation circuit 24 and the coupling circuit 25; 26 denotes a switch control circuit for controling the switch 21 and sending signals to the pulse width modulation circuit 24; and 42 to 47 refer respectively to signal lines.

Figure 2A:
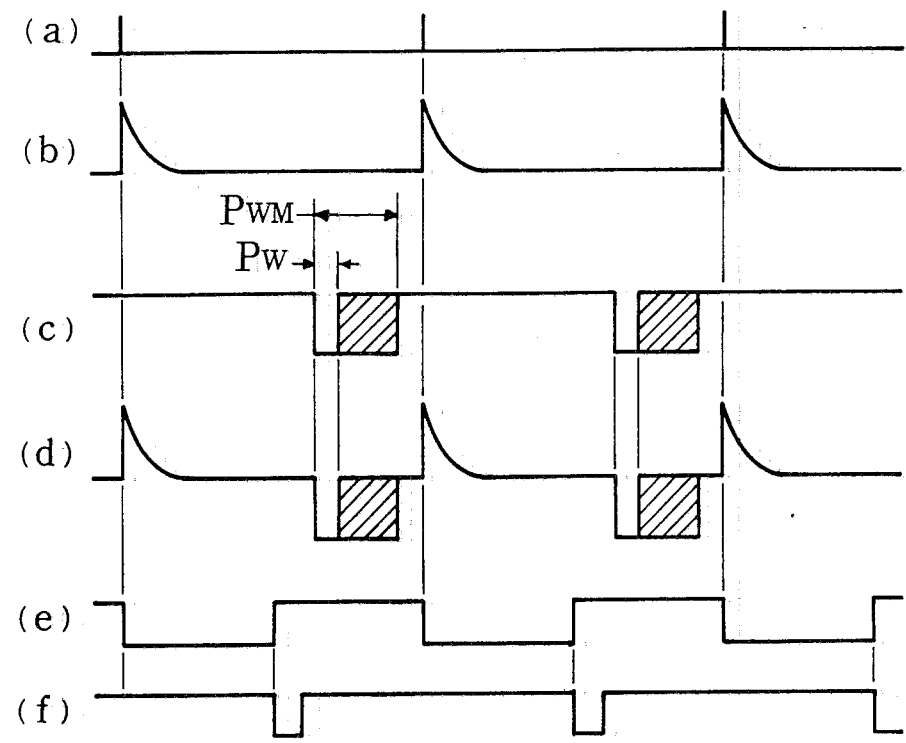
FIG. 2A and 2B show waveforms for explaining the operation of the circuit diagram of FIG. 1.
Figure 2B:
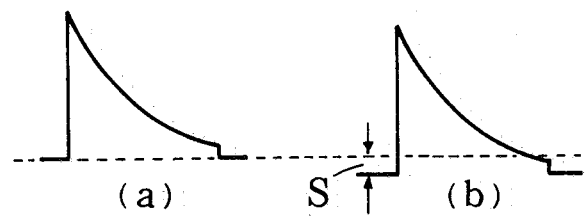

FIG. 2A and FIG. 2B shows explanatorily waveform diagrams of the operation of the devices shown in FIG. 1 according to this invention.

A CLOCK (a) for a timing standard of the circuit operation is shown in FIG. 2A. When a laser diode not shown is driven synchronizing with the clock (a), a signal (b) of FIG. 2A converted from back scattering optical waves of a fiber is obtained at the input terminal 15 of FIG. 1 and amplified by the preamplifier 11, which amplified signal is added to the AC amplifier 12 through the coupling capacitor 16 and amplified.

A waveform (a) of FIG. 2B at the output terminal 20 shifts to a level of a waveform shown in (b) of FIG. 2B at the input of the AC amplifier 12 after through the coupling capacitor 16. Such a lever shift S may be caused by the AC amplifier 12 itself too, because wherein capacitor coupled amplifiers may be included. The level shift S indicated in (b) of FIG. 2B depends on the wave forms, the repetition rate and amplitude thereof. In order to eliminate the level shift S, the level shift detector 49 operates as follows.

The output of the AC amplifier 12 is fed to the switch 21 through the resistor 32. Here, the switch 21 is switched on during the low level of the wave form (f) of FIG. 2A and the level of the sufficiently decreased waveform shown in (b) of FIG. 2A is memorized on the capacitor 33 for storaging. Then, the memorized level on the capacitor 33 is compared with the reference level added on an input marked as — in the operational amplifier 22, wherein a difference between both inputs of the operational amplifier 22 is amplified and the amplified difference is appeared at the output terminal 28. The amplified difference i.e. the error signal is fed to the operational amplifier 23 with the resistors 39 and 41 constructing the inverting amplifier, and the inversely amplified error signal is obtained at the output terminal 29 of the operational amplifier 23. The inversely amplified error signal is fed to the pulse width modulation circuit 24 and the switch control circuit 26 through the signal line 47.

The larger the amplitude of the waveform (b) of FIG. 2A at the input terminal 15 of the preamplifier 11 increases, the more the output of the AC amplifier 12 shifts to a negative direction and the more the level shift S increases as shown in (b) of FIG. 2B, thereby the voltage of the output terminal 27 is shifted to the negative direction the voltage of the output terminal 29 is shifted to the positive direction and the pulse width Pw of the output pulse (C) of the pulse width modulation circuit 24 is widened moving toward Pwm as shown in FIG. 2A.

The pulse (c) of the pulse width Pw in FIG. 2A is fed to the preamplifier 11 via the coupling circuit 25, amplified and synthesized with the amplified waveform (b), whereby the wave form (d) is gotten as shown in FIG. 2A at the output terminal 20. As the result of the above operation, the pulse width Pw indicated with oblique lines varies according to the level shift S, namely, the larger the level shift S becomes, the wider the pulse width Pw is widened moving toward Pwm and the smaller the level shift S becomes, the narrower the pulse width Pw becomes as shown in (C) and (d) of FIG. 2A.

The waveform (e) indicated in FIG. 2A is generated by a monostable multivibrator which is triggered by the clock (a) of FIG. 2A through the signal line 43 of FIG. 1.

The waveform (f) is generated by another monostable multivibrator triggered by a rising edge of the wave form (e) in FIG. 2A. The waveform (f) is fed to the switch 21 from the switch control circuit 26 through the signal line 42. During the low level of the waveform (f), the switch 21 is switched on, whereby the zero level of the signal at the output terminal 19 is sampled.

Here, in the waveform (d) of FIG. 2A, an area of the portion corresponding to the waveform (b) and an area of the portion corresponding to the pulse (c) are always controlled to be equal, whereby the zero level of the waveform to be obtained at the output terminal 19 is stably clamped to the reference level added to the input marked as — in the operational amplifier 22.

Consequently, the circuit returning again to the preamplifier 11, via the AC amplifier 12, the level shift detector 49, the pulse width modulation circuit 24 and the coupling circuit 25 constructs a servo means which is a negative feedback loop.

Figure 3:
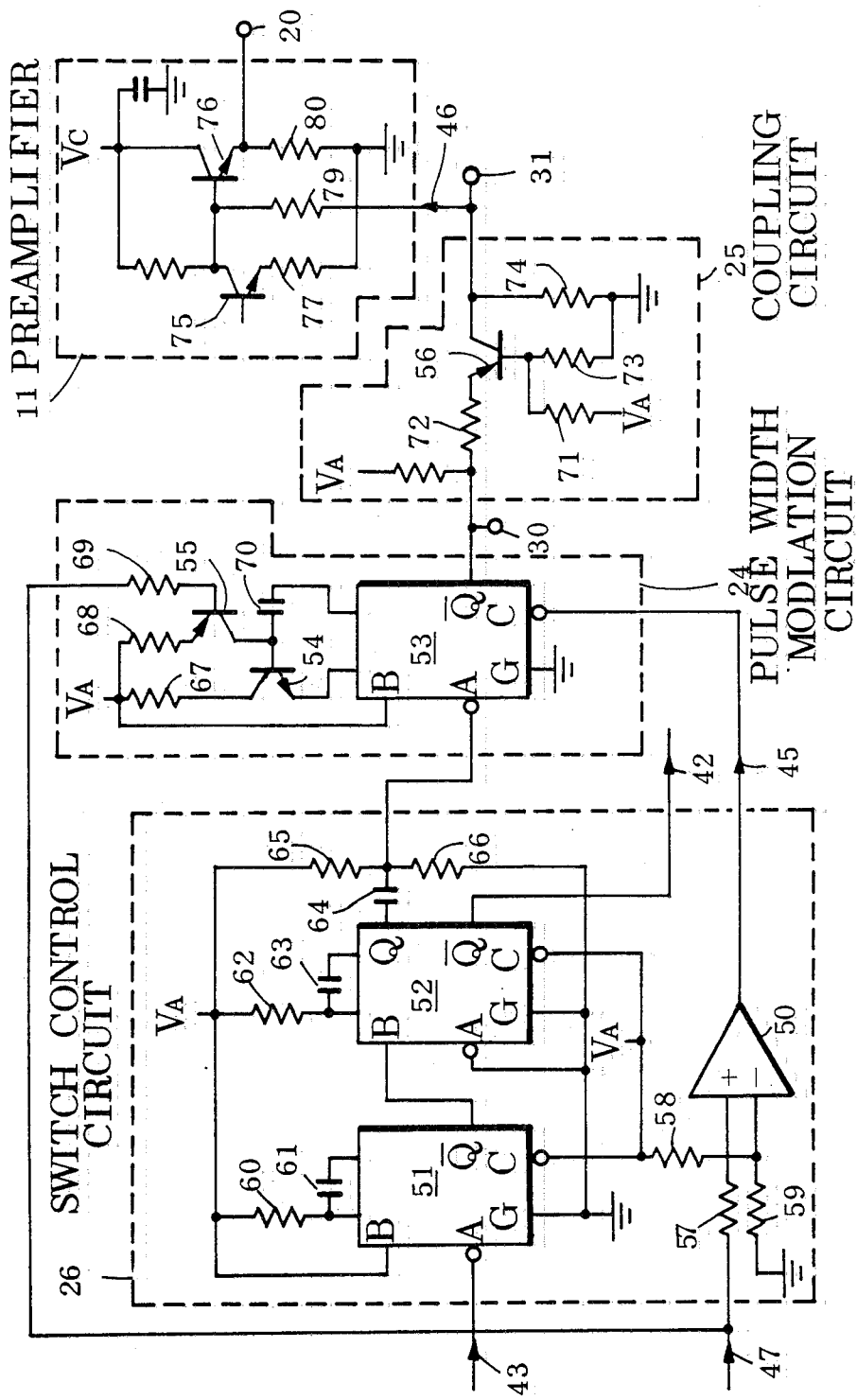
FIG. 3 is a circuit diagram showing by way of example, a switch control circuit, a pulse width modulation circuit and a coupling circuit in this invention.

FIG. 3 illustrates a circuit of an embodiment of a part of the preamplifier 11, the switch control circuit 26, the pulse width modulation circuit 24 and the coupling circuit 25.

The switch control circuit 26 comprises an operational amplifier 50 operating as a comparator with resistors 57 to 59, monostable multivibrators 51 and 52 with timing resistors 60 and 62 and capacitors 61 and 63 determining each pulse width, and a capacitor 64 to get a differentiated output. In FIG. 3, Va and Vc indicate power sources.

The pulse width modulation circuit 24 consists of a monostable multivibrator 53 with transistors 54 and 55 operating as a timing resistor, resistors 67 to 69 and a timing capacitor 70.

The coupling circuit 25 includes a transistor 56 and resistors 71 to 74.

In FIG. 3, the final stage circuit of the preamplifier 11 including transistors 75 and 76 and resistors 77 to 80 is shown only.

Referring now to FIG. 3, wherein like reference characters designate like or corresponding parts throughout FIG. 1.

The clock (a) of FIG. 2A being fed via the signal line 43, the monostable multivibrator 51 is, in FIG. 3, triggered by the falling edge thereof to get the waveform (e) of FIG. 2A at the $\overline{Q}$ terminal of the monostable multivibrator 51. The monostable multivibrator 52 is triggered by rising edges of the waveform (e) to generate the waveform (f) of FIG. 2A at the $\overline{Q}$ terminal thereof. The waveform (f) is fed to the switch 21 through the signal line 42.

On another side, the Q output of the monostable multivibrator 52 is differentiated by the capacitor 64 and resistors 65 and 66 and the falling edge of the Q output corresponding to the rising edge of the waveform (f) of FIG. 2A triggers the monostable multivibrator 53 in the pulse width modulation circuit 24.

The signal transmitted by the signal line 47, namely, the error signal is fed to the operational amplifier 50 operating as a comparator included in the switch control circuit 26 and to the base of the transistor 55 included in the pulse width modulation circuit 24 via resistor 69.

In the operational amplifier 50 operating as the comparator, a reference voltage determined by the resistors 58 and 59 at a − terminal and the error signal at a + terminal are comparated.

In case of the error signal at the + terminal being lower than the reference voltage at the − terminal of the operational amplifier 50, of which output makes the monostable multivibrator 53 clear through the signal line 45, the pulse (c) of FIG. 2A is not obtained therefore a high level at the output terminal 30 is kept.

The other way, the error signal being higher than the reference voltage, the signal sent out through the signal line 45 becomes to a high level, whereby the multivibrator 53 becomes triggerable. Then a current of a transistor 55 of the pulse width modulation circuit 24 is varied corresponding to a voltage level of the error signal, i.e. the current decreases corresponding to the high level of the error signal and the current increases corresponding to the low level of the error signal, thereupon the higher the error signal level becomes, the wider the pulse width Pw of the pulse (c) of the output terminal 30 becomes and the lower the error signal level becomes, the narrower the pulse width Pw becomes in FIG. 2A. The current of the transistor 55 is set up by the resistor 68, whereby the maximum pulse width Pwm and the minimum pulse width are provided. Namely, the circuit including the transistor 55 constructs a variable current circuit. In case of a narrower pulse width than the minimum pulse width being required, therefore the operational amplifier 50 being the comparator operates to clear the monostable multivibrator 53. Consequently, if the pulse width Pw is appropriately set, the operational amplifier 50 may be unnecessary. Here, the transistor 54 may be eliminated because the transistor 54 is employed to obtain the sufficiently large variable range of the pulse width Pw.

The output of the pulse width modulation circuit 24 is fed to the coupling circuit 25. The transistor 56 grounded its base has a low input impedance and a high output impedance, wherein signals at the input terminal 30 and the output terminal 31 have a same polarity.

By this coupling circuit 25, the output of the pulse width modulation circuit 24 is transmitted to the preamplifier 11 as a level compensation signal through the signal line 46. Then, the preamplifier 11 synthesizes the input signal added at the input terminal 15 and the level compensation signal, therefore the synthesized signal as shown in (d) of FIG. 2A appears at the output terminal 20. Here, the coupling circuit 25 is replaceable to a resistor if conditions of a bias and an impedance are satisfied therein.

A transistor 75 constructing the final stage of the preamplifier 11 is a common emitter amplifier and a transistor 76 constructs an emitter follower. A resistor 79 is selectable not to influence high frequency characteristics of the preamplifier 11

In FIG. 1, the pulse width modulation circuit 24 is replaceable to a pulse amplitude modulation circuit, wherein an amplitude variation of 80 dB is exemplarily required in a dynamic range of an input signal of OTDR. Consequently, the large variation of the pulse amplitude is required, and especially, when the pulse amplitude of the output of the pulse amplitude modulation circuit is so small as to be buried in noise, a wide dynamic rage with stable operation is unobtainable in comparison with employing the pulse width modulation circuit.

In the above embodiments, in case of using a high gain logarithmic amplifier as the AC amplifier 12, a distinguished effect is expectable.

Further, using a linear amplifier as the AC amplifier 12, the same performance as a high gain DC amplifier is obtainable, thereupon a driftless high accuracy amplifier is rather obtainable.

Depending on the invention, it is expected to stably operate because a zero level of a signal is sampled to compensate the level with a negative feedback.

The described invention provides a level compensation circuit to make an AC amplifier having a gain greater than 80 dB stably operate.

It is to be understood that the invention is not limited in its application to the details of construction and arrangement of devices illustrated in the accompanying drawings, since the invention is capable of other embodiments and of being practiced or carried out in various ways. Also it is to be understood that the phraseology or terminology employed herein is for the purpose of description and not of limitation.

What is claimed is:

1. A level compensation circuit comprising:
    a preamplifier for amplifying an input signal and producing a synthesized signal of the input signal and a level compensation signal;
    an AC amplifier for amplifying the synthesized signal;
    level shift detection means for detecting a zero level of an output signal of said AC amplifier, and for comparing said zero level to a reference level to produce an error signal;
    pulse width modulation means for generating a pulse of a pulse width corresponding with said error signal; and
    coupling means for coupling said pulse generated by said pulse width modulation means to said preamplifier.

2. A level compensation circuit as claimed in claim 1, wherein said lever shift detection means comprises switch means and a storage capacitor for detecting and storing said zero level, and comparing means for comparing said zero level stored on said storage capacitor to said reference level and providing said error signal.

3. A level compensation circuit as claimed in claim 1, wherein said pulse width modulation means comprises a variable current circuit including a transistor of which current is variable according to said error signal, a capacitor for setting a time constant with said variable current circuit and a monostable multivibrator for generating a pulse of a pulse width corresponding with said time constant.

4. A level compensation circuit as claimed in claim 1, wherein said coupling means includes a common base transistor.

5. A level compensation circuit as claimed in claim 1, wherein said coupling means includes a resistor.

6. A level compensation circuit as claimed in claim 3, wherein said monostable multivibrator generates no pulse when said error signal is within a predetermined value.

* * * * *